(12) United States Patent
Geneczko et al.

(10) Patent No.: US 6,974,219 B1
(45) Date of Patent: Dec. 13, 2005

(54) ZERO REFLECTANCE DESIGN FOR TILTED DEVICES

(75) Inventors: Jeannie Geneczko, Carlisle, MA (US); Richard Blackwell, Andover, MA (US)

(73) Assignee: Bae Systems Information and Electronic Systems Integration Inc, Nashua, NH (US)

( * ) Notice: Subject to any disclaimer, the term of this patent is extended or adjusted under 35 U.S.C. 154(b) by 0 days.

(21) Appl. No.: 10/888,209

(22) Filed: Jul. 9, 2004

(51) Int. Cl.[7] ............................................. G02B 27/00
(52) U.S. Cl. ..................... 359/613; 359/601; 359/900; 250/332
(58) Field of Search ............................... 359/601–613; 250/332, 353; 257/432, 436

(56) References Cited

U.S. PATENT DOCUMENTS

| | | |
|---|---|---|
| 5,086,328 A | 2/1992 | Kasai et al. |
| 5,485,304 A * | 1/1996 | Kaeriyama ................... 359/291 |
| 5,561,593 A | 10/1996 | Rotolante |
| 5,602,393 A | 2/1997 | Gerard |
| 5,629,520 A | 5/1997 | Sonstroem |
| 5,760,398 A | 6/1998 | Blackwell et al. |
| 5,811,815 A | 9/1998 | Marshall et al. |
| 5,818,043 A * | 10/1998 | Buchy et al. ................ 250/332 |
| 5,929,440 A * | 7/1999 | Fisher ...................... 250/338.1 |
| 6,157,404 A | 12/2000 | Marshall et al. |
| 6,245,667 B1 | 6/2001 | Wang et al. |
| 6,580,509 B1 | 6/2003 | Hutchin et al. |
| 6,667,479 B2 | 12/2003 | Ray |
| 6,721,539 B1 | 4/2004 | O'Brien et al. |
| 6,862,147 B1 * | 3/2005 | Sonstroem ................... 359/738 |
| 2002/0011759 A1 * | 1/2002 | Adams et al. .............. 310/309 |
| 2002/0135869 A1 | 9/2002 | Banish et al. |

FOREIGN PATENT DOCUMENTS

| | | |
|---|---|---|
| WO | WO 97/21250 | 6/1997 |

* cited by examiner

*Primary Examiner*—Drew A. Dunn
*Assistant Examiner*—Mark Consilvio
(74) *Attorney, Agent, or Firm*—Maine & Asmus

(57) ABSTRACT

Techniques that eliminate or otherwise reduce retroreflections associated with focal plane arrays (cooled and uncooled) and other tilted devices are disclosed. The device topology is designed so that incoming radiation is reflected outside of the incoming focusing optical cone. Planarization is used to eliminate concave geometries and angled sidewalls can be used to eliminate convex geometries, as such geometries cause retroreflection. The resultant structure is covered with reflective material (e.g., aluminum, titanium tungsten, or other standard metallization), which not only safely reflects light from the scene, but also prevents reflections from the underlying geometries of the via. Devices configured in accordance with the principles of the present invention require less tilt, thereby minimizing optical distortion.

25 Claims, 3 Drawing Sheets

ZERO REFLECTANCE DESIGN FOR TILTED DEVICES

FIELD OF THE INVENTION

The invention relates to retroreflection, and more particularly, to a zero reflectance design for devices, such as focal plane arrays, that can be tilted or tilted/rotated about the Z-axis, so as to minimize or eliminate retroreflections.

BACKGROUND OF THE INVENTION

Retroreflection in the context of a focal plane array (FPA) and other such devices is radiation (e.g., infrared) that is reflected by the FPA, so that the radiation travels back in the direction from which it came, and returns back to its source. Such reflections can be problematic, depending on the nature of the particular application in which the device causing the retroreflections is being used.

For example, consider the application where the FPA is employed to perform covert scanning (e.g., for purposes surveillance and/or targeting) of a target area to detect certain types of activity, such as personnel movement or the presence of aircraft. Retroreflections from the FPA can be used to identify the presence and/or location of the FPA, thereby compromising the covert nature of the FPA. Such retroflections might also be used to trigger counter measures, such as evasive maneuvers or the tracking and/or targeting of the FPA.

Other systems that employ fast, wide field of view optics, such as those used in many uncooled microbolometer detector systems, are also particularly vulnerable to the problems associated with retroreflections. Generally stated, it is desirable to minimize or otherwise eliminate retroflections from an FPA or other devices used for covert imaging, detection, tracking, and/or targeting, so as to avoid the negative consequences that may flow therefrom.

One technique to reduce retroreflections involves tilting the device, in attempt to cause reflections to travel to locations other than their source, so as to prevent their detection. However, tilting the device does not necessarily eliminate retroreflections, given conventional device topologies. In addition, the extent of tilt that can be applied is limited, given performance issues of the device. For instance, excessive tilt causes optical distortion in an FPA system.

Another known technique employs non-reflective material (sometimes referred to as an absorbing cap) that covers the metallized or reflective portions of the device vulnerable to retroreflections. Such layers generally need to be relatively thick to be effective in lowering reflections to acceptable levels. A thick dielectric layer, such as a nitride, can reduce reflections; but the effectiveness here is limited, and is dependent on the wavelength of interest.

Anti-reflective coatings can also be used to reduce retroreflections. However, such coatings require a significant number of different film layers that may not be friendly to fabrication processes typically associated with certain sensitive devices, such as microbolometers, with or without their underlying read out circuits. Such coatings also tend to be thicker than is desired. Other solutions may involve major changes in existing device designs, which may be unacceptable for a number of reasons (e.g., impact on cost and device performance).

What is needed, therefore, are techniques that eliminate or otherwise reduce the retroreflections associated with focal plane arrays (cooled and uncooled) and other such devices.

SUMMARY OF THE INVENTION

One embodiment of the present invention provides a method for manufacturing a tilted focal plane array having a via structure configured to eliminate retroreflections. The method includes planarizing each via so as to provide each via with a planarized topmost surface and to substantially eliminate internal physical geometries of each via. The method further includes creating angled sidewalls for each via so as to provide each via with built-in tilt. Note that the order in which the planarizing and creating of angled sidewalls is performed can be changed, depending on the materials and processing techniques employed in the fabrication process. The method continues with covering the planarized topmost surface and the angled sidewalls of each via with a reflective material. In one embodiment, the covering includes metallizing the planarized topmost surface and the angled sidewalls of each via.

The reflective material can be, for example, one of aluminum, titanium tungsten, or other standard metals typically used in semiconductor fabrication, with consideration given to practicalities such as processing ease and the avoidance of contaminants. The planarizing may include, for instance, filling internal concave geometries of each via with polyimide, spin-on-glass, or selectively deposited metal. In one such embodiment, the planarizing includes filling internal concave geometries of each via with polyimide, and creating the angled sidewalls includes etching the polyimide.

Creating the angled sidewalls may include, for example, etching the planarized topmost surface. The angled sidewalls are not intended to be limited to polyimide. For instance, the angled sidewalls can be created using spin-on-glass or sputter deposited dielectric or any other materials that can be deposited in semiconductor manufacturing operations, and subsequently defined by photolithography and etched. Alternatively, the angled sidewalls can be created using photodefinable polyimide, which would eliminate the need for etching sidewalls. In one particular embodiment, the angled sidewalls are angled at about 45° relative to a focal plane of the focal plane array. However, the sidewalls can be adjusted to a wide range of tilt, depending on the tilt desired.

Another embodiment of the present invention provides a tilted focal plane array having a via structure that is configured to eliminate retroreflections. The array includes a number of detection areas for detecting radiation. The array further includes one or more via structures, each having a planarized topmost surface for substantially eliminating internal physical via geometries, and angled sidewalls so as to provide each via with built-in tilt. The array further includes a reflective material covering the planarized topmost surface and the angled sidewalls of each via.

The reflective material can be, for example, a metal deposited on the planarized topmost surface and the angled sidewalls of each via. Example reflective materials include aluminum, titanium tungsten, or other metals typically used in semiconductor fabrication. In one particular embodiment, at least one of the planarized topmost surfaces and the angled sidewalls are polyimide. In another embodiment, each planarized topmost surface for substantially eliminating internal physical via geometries is at least one of spin-on-glass or selectively deposited metal. The angled sidewalls (e.g., polyimide, spin-on-glass, sputter deposited dielectric, photodefinable polyimide) can be angled at about 45° relative to a focal plane of the focal plane array.

Another embodiment of the present invention provides a via structure configured to reduce retroreflections of a tilted device. The via structure includes a planarized topmost surface for substantially eliminating internal physical via geometries. The via structure further includes angled sidewalls so as to provide the via with built-in tilt. The via structure further includes a reflective material covering the planarized topmost surface and the angled sidewalls.

The reflective material can be, for example, one of aluminum, titanium tungsten, or other metals typically used in semiconductor fabrication. In one particular embodiment, at least one of the planarized topmost surface and the angled sidewalls is polyimide. In another embodiment, the planarized topmost surface is at least one of spin-on-glass or selectively deposited metal. The angled sidewalls (e.g., polyimide, spin-on-glass, sputter deposited dielectric, photodefinable polyimide) can be angled, for instance, at about 45° relative to a focal plane of the tilted device.

Other embodiments of the present invention exploit the recognition that via structures are a primary contributor to retroreflections. One such embodiment provides a method for manufacturing a tilted focal plane array having a via structure configured to reduce retroreflections. The method includes providing a via topology configured to reflect incoming radiation outside of an incoming focusing optical cone associated with an imaged scene. Another such embodiment provides a via structure configured to reduce retroreflections of a tilted device. The via structure includes a topology configured to reflect incoming radiation outside of an incoming focusing optical cone associated with an imaged scene.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide techniques that eliminate or otherwise reduce the retroreflections associated with focal plane arrays (cooled and uncooled) and other such devices. In general, the topology of the devices is designed so that the incoming radiation is reflected outside of the incoming focusing optical cone or "f-cone". Devices configured in accordance with the principles of the present invention require less tilt (depending on the optics, such as the lens F number), thereby minimizing optical distortion. Also, there is minimal or no impact on cost once the manufacturing processes and techniques as described herein are in place, and no expensive or impractical coatings required to reduce reflections that would otherwise be necessary in certain cases. Also, there is minimal or no impact on device performance and size.

Retroreflections: Tilt and Device Topology

As previously discussed, retroreflections are conventionally reduced by tilting the device. However, even a tilted device can cause retroreflections, primarily due to the device topology. As is known, the topology of an FPA generally includes a plurality of detection areas (sometimes referred to as bridge sections), with each detection area surrounded by opposing legs sections (e.g., in the x direction) and contact sections (e.g., in the y direction). Via plugs (or vias for short) provide electrical contact and/or structural support where appropriate.

To assess the degree to which such topology contributes to retroreflections, a 640×480 28 $\mu$m pixel FPA was optically tested for reflections with both F/1.0 and F/1.7 optics. Tilts of 0°, 15°, and 25° were chosen with a 0° rotation. At horizontal polarization, the highest signals at 0° tilt were from the legs and then the contacts. When the tilt of the device was changed to 15°, the reflectivity magnitude dropped. It was noted, however, that although the reflections from the legs and contacts were still strong, the signal from the vias became dominant. The weakening and receding of the signal coming from the legs could be seen on a 2-d reflectivity map for that tilt.

At the 25° tilt, the signal from the legs and the contacts was negligible in comparison to the reflectance from the vias. Since the bridge areas are planar, the 25° tilt eliminated the retroreflections from these surfaces. A 2-d reflectivity map for 25° tilt at F/1.7 (for horizontal polarization at 0° rotation) indicated that the maximum reflectance signal occurs along the rows and columns of the topology about every 25 $\mu$m, which approximates the pixel spacing of 28 $\mu$m. These maxima originate from the vias. A similar effect was seen for vertical polarization. Thus, the dominant contributor to reflectance on a tilted focal plane array is a non-planar reflective structure, such as a via designed for structure and electrical contact without consideration of its reflective characteristics.

Figure 1:
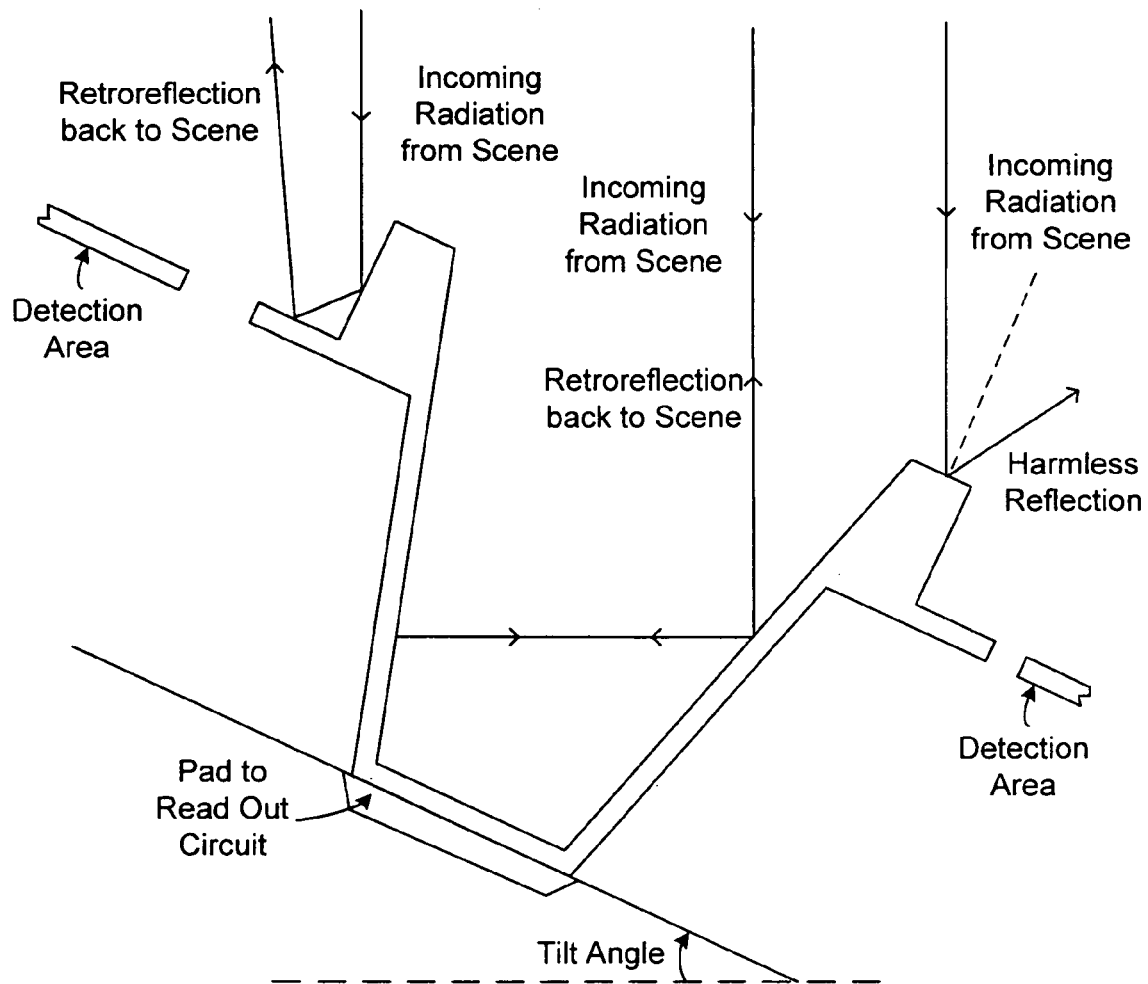
FIG. 1 illustrates a tilted, metallized via plug having conventional topology, where the applied tilt does not scatter all incoming radiation outside of the incoming f-cone.

FIG. 1 illustrates a metallized via having conventional topology. The via might be included, for example, in an uncooled FPA that is tilted at 25°. A typical via is a partial metal fill of an etched structure, and is sometimes covered by a layer of dielectric. The geometries of a via can mimic parabolic and corner cube reflectors, depending on the size and scale of the internal and external physical geometries and the material optical properties. In short, via plugs are designed to provide electrical contact and/or structural support, not to minimize or eliminate reflections.

For example, and with reference to FIG. 1, incoming radiation from some scene in the FPA field of view is received at the FPA. The geometry of the via causes at least one incoming path of radiation to be reflected back to its source along the same path, thereby providing a first instance of retroreflection back to the scene. Another incoming path is reflected back along a path that is similar to the incoming path, thereby providing a another instance of retroreflection. Thus, despite the 25° tilt of the FPA, not all incoming radiation is reflected outside of the f-cone, so as to be a harmless reflection.

As previously discussed, such retroreflections can have substantially adverse implications, particularly in covert applications. Further note that conventional techniques for reducing reflections, such as covering the via with a dielectric layer causes the height of the associated vias to also increase, which may be detrimental to the overall lowering of reflectivity. In addition, such conventional techniques do not eliminate reflections back to the source.

Low Reflectance Via Topology

Retroreflection for tilted devices can be eliminated or otherwise reduced by adding an additional criteria to the devices: design the via topology so that the incoming radiation is reflected outside of the incoming f-cone. Thus, via materials and processing are selected to produce a via topology having geometry that reduces reflections at lower device tilt angles (e.g., less than 15°) and eliminates reflections at higher device tilt angles (e.g., 15° to 30°), without sacrificing electrical integrity or structural support of the tilted FPA.

Figure 2:
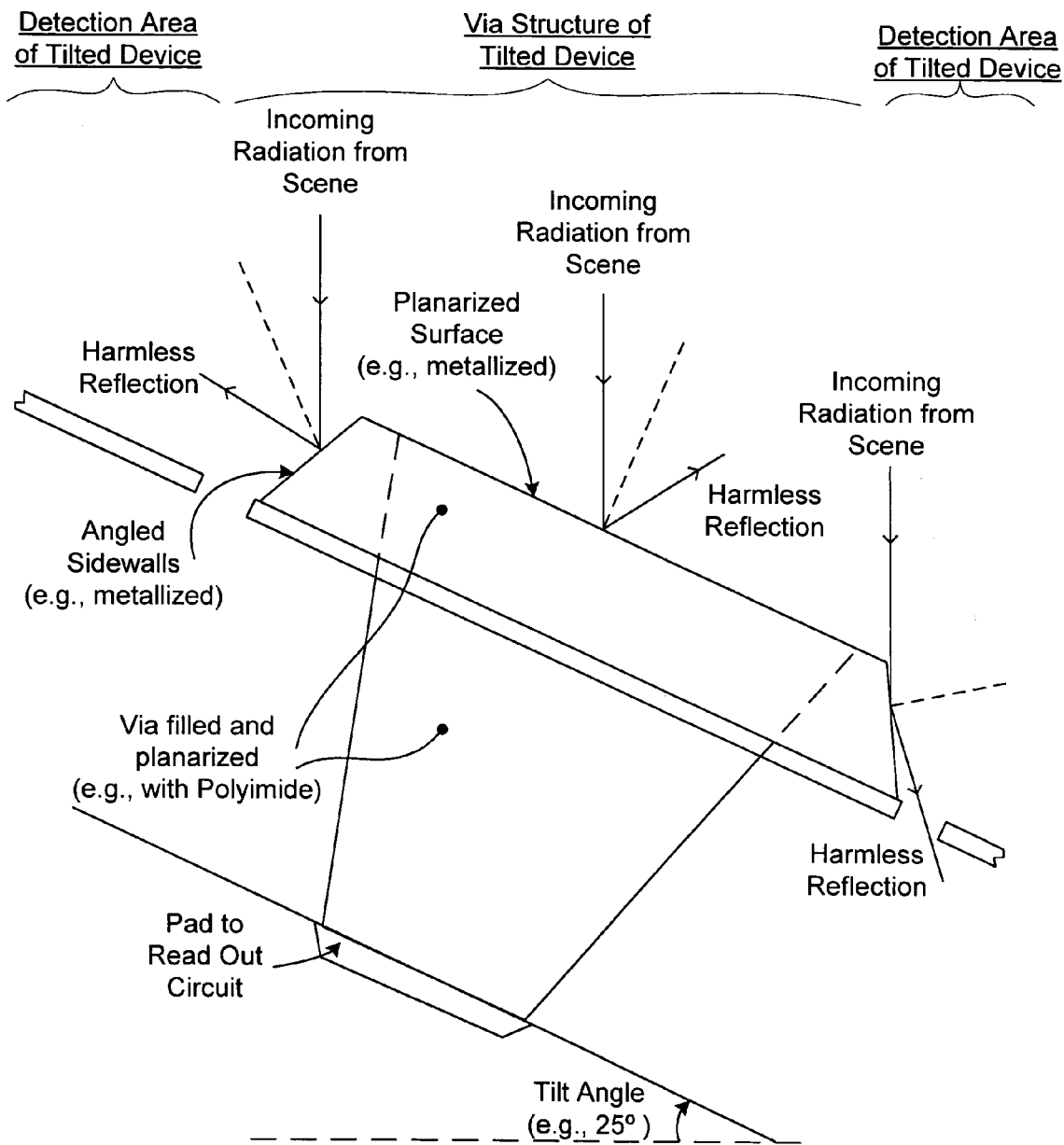
FIG. 2 illustrates a tilted, metallized via plug having a topology configured to reduce or eliminate retroreflections in accordance with an embodiment of the present invention.

FIG. 2 illustrates a tilted, metallized via plug having a topology configured to eliminate retroreflections in accordance with an embodiment of the present invention. In this example, the FPA is tilted at about 25°. In addition, the top surface of the vias has been planarized, and the sidewalls have been angled. The planarized surface and angled sidewalls are metallized. Such topology, which would apply to each via of the FPA, scatters incoming radiation outside of the incoming f-cone.

For instance, the combination of planarizing the via surface, metallizing it, and tilting the FPA (e.g., at 25°) eliminates reflections from the top surface of the via. In addition, planarizing the via eliminates concave features of that surface. This eliminates reflective geometries associated with the concave features, as such geometries can act as a corner cube or parabolic reflector. The external angled sidewalls, which replace the typical convex and vertical geometries of the outside via structure, provide a built-in tilt of, for example, about 45°. Note, however, that the sidewalls can be adjusted to a wide range of tilt, as desired. With such combinations of FPA tilt, planarization, angled sidewalls, and metallization, only harmless reflections (those which do not travel back to the scene where they originated) are caused by the via.

Variations on this combination are also possible, as will be apparent in light of this disclosure. For example, alternative embodiments may combine FPA tilt, planarization, and metallization, or planarization, angled sidewalls, and metallization, or planarization and metallization, or angled sidewalls and metallization, or FPA tilt, angled sidewalls, and metallization. Numerous variations can be used here. In any such cases, a degree of retroreflections will be eliminated. Thus, the combination of features, as well as the fabrication sequence used, will depend on the particular application and the materials and processes available to the manufacturer.

In one embodiment, the illustrated via topology is accomplished using polyimide to fill and planarize the via, optimizing the photolithography to achieve the angled sidewall (e.g., 45° relative to the focal plane of the array), and then metallizing the planarized surface and angled sidewalls. Note that the construction of an angled sidewall in polyimide complements the tilt of the FPA. Polyimide sidewalls angled between 35° and 55° are readily attainable using conventional photolithography processing and etch tools. Further note that metallizing the surface of the via negates any possibility of reflections from the geometries that the polyimide covers.

Note that other suitable materials or combinations of materials can be used for the planarization of the via (e.g., nitride or other dielectric material), and the angle of the sidewalls can vary (e.g., 25° to 65°), depending on the particular materials and photolithography processes used and the desired results. In any event, the planarization, metallization, and/or angling of the sidewalls will provide a via geometry that yields lower retroreflections. In addition, other via topology configurations will be apparent in light of this disclosure. For instance, convex feature sizes of the via can be minimized by minimizing outside corner radii of curvatures (as opposed to angling the sidewalls). Reducing the overall dimensions of the via would also assist in lowering undesired reflections.

Methodology

Figure 3:
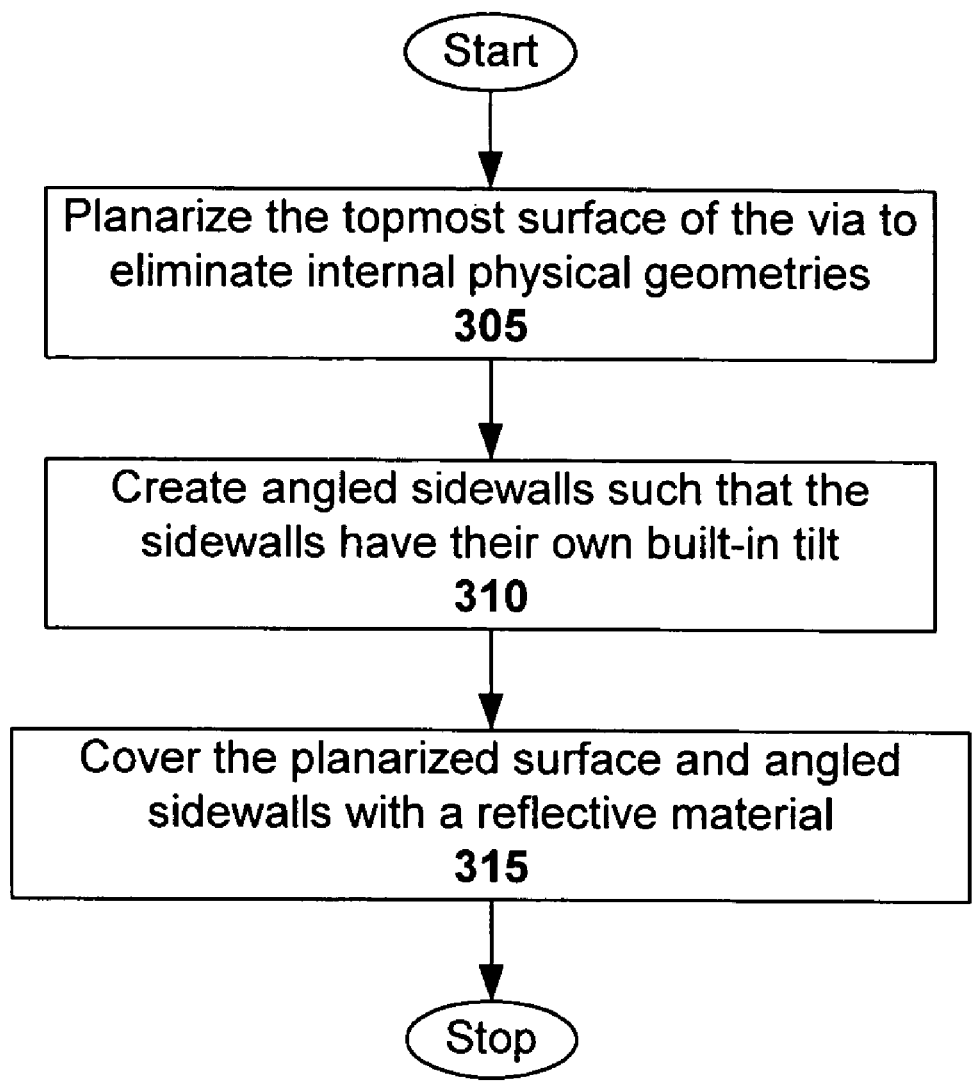
FIG. 3 illustrates a method for manufacturing a tilted FPA having a via topology configured to eliminate retroreflections in accordance with an embodiment of the present invention.

FIG. 3 illustrates a method for manufacturing a tilted FPA (or other tilted device) having a via topology configured to eliminate retroreflections in accordance with an embodiment of the present invention. The method can be used, for example, to manufacture the via topology illustrated in FIG. 2.

The method includes planarizing 305 the topmost surface of the via to eliminate internal physical geometries. As previously discussed, this planarization can be carried out by filling the internal concave geometries of each via included in the device with polyimide. Other suitable materials that could be used here include, for example, spin-on-glass or selectively deposited metal (where the metal is only deposited in the concave geometries of the via).

The planarizing may include, for example, depositing polyimide to the surface of the wafer from which the FPA is being fabricated, and then etching the polyimide as necessary to planarize the surface. This etching is not necessary if the polyimide sufficiently planarizes the surface after deposit and cure. Photodefinable polyimide can be used and the via then photo defined. In this case, there would be no etching as it would preclude defining the polyimide.

The method continues with creating 310 angled sidewalls. In one embodiment, the sidewall angle approaches a 45° angle and effectively mimics tilt, which operates in conjunction with the tilt angle of the FPA. If the planarization is accomplished using polyimide, for example, then the angled sidewalls can be formed by photodefining and then etching the polyimide using conventional photolithography tools and processing. Alternatively, a photodefinable polyimide can be used to create the angled sidewalls. Here, no etching would be required, as the photodefinable polyimide would form the angled sidewalls as part of its standard processing characteristics. Note that the order within steps 310 and 305 can be changed, depending on the semiconductor materials and processes chosen to fabricate the FPA.

The angled sidewalls are not intended to be limited to polyimide, and can be created using other materials as well. For instance, creating the angled sidewalls can be achieved using spin-on-glass or sputter deposited dielectric or any other materials that can be deposited in semiconductor manufacturing operations, and subsequently defined by photolithography and etched (if necessary).

The method continues with covering 315 the planarized surface and the angled sidewalls with a reflective material, which also can be carried out with conventional tools and techniques. In one embodiment, this step is carried out by metallizing the planarized surface and the angled sidewalls. The metal can be, for example, a 200 Å layer of aluminum or titanium tungsten, or other suitable reflective material that can be deposited onto the via structure, and then photodefined and etched accordingly. The thickness of the covering will depend on the material used, but 100 Å to 500 Å is typically acceptable. Further note that this reflective layer will eliminate reflections from underlying structures within the via.

Note that the covering 315 can be followed by additional steps not shown in FIG. 3. For instance, the method may further include photodefining the area covered with reflective material, and dry etching the reflective material so as to retain that material only on the via structures. Note that the method will allow releasing the detector structure (bridge and legs) so that they are freely suspended, by etching a sacrificial layer away, as is conventionally done.

The foregoing description of the embodiments of the invention has been presented for the purposes of illustration and description. It is not intended to be exhaustive or to limit the invention to the precise form disclosed. Many modifications and variations are possible in light of this disclosure. For instance, the reflective material layer that covers the planarized area and angled sidewalls can alternatively be an absorbing material layer, such as glass (which can be opaque to IR), assuming that the thickness of that layer and its ability to reduce retroreflections are satisfactory given a particular application. It is intended that the scope of the invention be limited not by this detailed description, but rather by the claims appended hereto.

What is claimed is:

1. A method for manufacturing a tilted focal plane array having a via structure that fills and planarizes at least one via and is configured to reduce retroreflections, the method comprising:
    planarizing each via so as to provide each via with a planarized topmost surface for substantially eliminating internal physical geometries of each via;
    creating external angled sidewalls for each via so as to provide each via with a built-in tilt; and
    covering the planarized topmost surface and the external angled sidewalls with a reflective material.

2. The method of claim 1 wherein the covering includes metallizing the planarized topmost surface and the external angled sidewalls of each via.

3. The method of claim 1 wherein the reflective material is selected from one of the group consisting of aluminum and titanium tungsten.

4. The method of claim 1 wherein the planarizing includes filling internal concave geometries of each via with polyimide.

5. The method of claim 1 wherein the planarizing includes filling internal concave geometries of each via with at least one of the group consisting of spin-on-glass and selectively deposited metal.

6. The method of claim 1 wherein the external angled sidewalls are angled at about 45° relative to a focal plane of the focal plane array.

7. The method of claim 1 wherein the planarizing includes filling internal concave geometries of each via with polyimide, and creating the external angled sidewalls includes etching the polyimide.

8. The method of claim 1 wherein creating the external angled sidewalls includes etching the planarized topmost surface.

9. The method of claim 1 wherein creating the external angled sidewalls is carried out using one of the group consisting of spin-on-glass and sputter deposited dielectric.

10. The method of claim 1 wherein creating the external angled sidewalls is carried out using photodefinable polyimide.

11. A tilted focal plane array having a at least one via structure that fills and planarizes at least one via and is configured to reduce retroreflections, the array comprising:
    a number of detection areas for detecting radiation;
    each via structure having a planarized topmost surface for substantially eliminating internal physical via geometries and external angled sidewalls so as to provide each via with a built-in tilt; and
    a reflective material covering the planarized topmost surface and the external angled sidewalls.

12. The array of claim 11 wherein the reflective material is a metal deposited on the planarized topmost surface and the external angled sidewalls of each via.

13. The array of claim 11 wherein the reflective material is one of the group consisting of aluminum and titanium tungsten.

14. The array of claim 11 wherein at least one of the planarized topmost surfaces and the external angled sidewalls are polyimide.

15. The array of claim 11 wherein each planarized topmost surface for substantially eliminating internal physical via geometries is at least one of the group consisting of spin-on-glass and selectively deposited metal.

16. The array of claim 11 wherein the external angled sidewalls are angled at about 45° relative to a focal plane of the focal plane array.

17. The array of claim 11 wherein the external angled sidewalls include one of the group consisting of spin-on-glass, sputter deposited dielectric, and photodefinable polyimide.

18. A via structure that fills and planarizes at least one via and is configured to reduce retroreflections of a tilted device, comprising:
    a planarized topmost surface for substantially eliminating internal physical via geometries;
    external angled sidewalls so as to provide each via with a built-in tilt; and
    a reflective material covering the planarized topmost surface and the external angled sidewalls.

19. The via structure of claim 18 wherein the reflective material is a metal.

20. The via structure of claim 18 wherein the reflective material is one of the group consisting of aluminum and titanium tungsten.

21. The via structure of claim 18 wherein at least one of the planarized topmost surface and the external angled sidewalls is polyimide.

22. The via structure of claim 18 wherein the planarized topmost surface is at least one of the group consisting of spin-on-glass and selectively deposited metal.

23. The via structure of claim 18 wherein the external angled sidewalls are angled between 35° and 55° relative to a focal plane of the tilted device, and include one of polyimide, spin-on-glass, sputter deposited dielectric, or photodefinable polyimide.

24. A method for manufacturing a tilted focal plane array having a via structure configured to reduce retroreflections, the method comprising:
    providing a via topology for said via structure configured to reflect incoming radiation outside of an incoming focusing optical cone associated with an imaged scene, by filling and planarizing a via to provide at least one external angled sidewall and a substantially planarized topmost surface, wherein said substantially planarized topmost surface and said external angled sidewall of said via topology reflect said incoming radiation outside of said incoming focusing optical cone.

25. A via structure that fills and planarizes a via and is configured to reduce retroreflections of a tilted device, comprising:

a via topology for said via structure configured to reflect incoming radiation outside of an incoming focusing optical cone associated with an imaged scene wherein said via topology includes at least one external angled side wall and with a substantially planarized topmost surface, wherein said substantially planarized topmost surface and said external angled sidewall of said via topology reflect said incoming radiation outside of said incoming focusing optical cone.

* * * * *